US008221557B2

(12) United States Patent
Hutto

(10) Patent No.: US 8,221,557 B2
(45) Date of Patent: Jul. 17, 2012

(54) SYSTEMS AND METHODS FOR EXPOSING SEMICONDUCTOR WORKPIECES TO VAPORS FOR THROUGH-HOLE CLEANING AND/OR OTHER PROCESSES

(75) Inventor: Kevin W. Hutto, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 11/774,419

(22) Filed: Jul. 6, 2007

(65) Prior Publication Data
US 2009/0007934 A1    Jan. 8, 2009

(51) Int. Cl.
B08B 3/10      (2006.01)
C23C 16/00    (2006.01)

(52) U.S. Cl. .............. 134/56 R; 134/104.2; 134/166 R; 134/902; 118/728

(58) Field of Classification Search ............. 134/95.2, 134/95.3; 118/728
See application file for complete search history.

(56) References Cited

U.S. PATENT DOCUMENTS

| 4,768,291 A | 9/1988 | Palmer |
| 4,984,597 A | 1/1991 | McConnell et al. |
| 5,294,568 A | 3/1994 | McNeilly et al. |
| 5,624,499 A * | 4/1997 | Mizuno et al. ............ 118/725 |
| 5,807,439 A | 9/1998 | Akatsu et al. |
| 6,089,184 A * | 7/2000 | Kaizuka et al. ......... 118/723 VE |
| 6,486,083 B1 | 11/2002 | Mizuno et al. |
| 2004/0000330 A1* | 1/2004 | Kwon et al. ............ 134/102.2 |
| 2004/0099943 A1* | 5/2004 | Meguro et al. ............ 257/701 |
| 2004/0235308 A1* | 11/2004 | Sato et al. ............ 438/704 |
| 2007/0166458 A1* | 7/2007 | Yamoto ............ 427/248.1 |

FOREIGN PATENT DOCUMENTS

WO   WO 2005067016 A1 *   7/2005

OTHER PUBLICATIONS

Lefebvre, Arthur H., Atomization and Sprays, 1989, Hemisphere Publishing Corporation, ISBN 0-89116-603-3.

* cited by examiner

Primary Examiner — Michael Kornakov
Assistant Examiner — Natasha Campbell
(74) Attorney, Agent, or Firm — Perkins Coie LLP

(57) ABSTRACT

Systems and methods for exposing semiconductor workpieces to vapors for through-hole cleaning and/or other processes are disclosed. A representative method includes exposing a semiconductor workpiece to a vapor, with the semiconductor workpiece having an opening extending from a first surface of the workpiece through the workpiece to a second surface facing opposite from the first surface. The opening can include a contaminant, and the method can further include drawing the vapor and the contaminant through at least a portion of the opening and away from the second surface of the semiconductor workpiece.

21 Claims, 4 Drawing Sheets

SYSTEMS AND METHODS FOR EXPOSING SEMICONDUCTOR WORKPIECES TO VAPORS FOR THROUGH-HOLE CLEANING AND/OR OTHER PROCESSES

TECHNICAL FIELD

The present disclosure is directed generally to systems and methods for exposing semiconductor workpieces to vapors. The vapors can be used for cleaning through-holes in the workpieces, and/or for other processes.

BACKGROUND

Several types of semiconductor devices include semiconductor dies having active devices on a front surface of the die and bond pads or other connective terminals on the opposite side of the die. For example, imaging dies can include image sensors located on a front surface of the die and bond pads for electrically coupling the sensors to other circuit elements. The bond pads are positioned on the back surface of the die to prevent them from interfering with the operation of the sensors, and/or to take advantage of the available surface area at the back surface. Through-wafer interconnects (TWIs) are used to conduct electrical signals from the sensors and associated circuitry, through the die to the bond pads at the back surface. The TWIs are typically formed by making a blind via in the die, filling the via with solder, and then grinding the back surface of the die to expose the blind end of the via, which is used to form the bond pad. A solder ball can then be attached to the bond pad and can be reflowed to couple the die to external devices. In other embodiments, the via can be made to extend entirely through the die without the need for a backgrinding process.

FIG. 1A schematically illustrates a representative etchant chamber 90 configured in accordance with the prior art and used to form vias in a plurality of workpieces 60. The workpieces 60 can be appropriately masked and then positioned side-by-side or otherwise arranged in the etchant chamber 90. The flow of an etchant through the etchant chamber 90 produces vias in the workpieces 60. FIG. 1B schematically illustrates a representative first workpiece 60a having blind holes 63a, and FIG. 1C schematically illustrates a representative second workpiece 60b having through-holes 63b. Before the holes shown in FIGS. 1B and 1C are further processed to form completed vias, they are cleaned. In the case of the blind holes 63a shown in FIG. 1B, the first workpiece 60a is placed in an etchant chamber or other generally similar chamber and exposed to dry-etch chemicals to clean the blind holes 63a. In the case of the through-holes 63b shown in FIG. 1C, the second workpiece 60b is typically positioned in a liquid bath 91 (shown schematically in FIG. 1D) along with other similar workpieces to remove contaminants from the through-holes 63b.

While the foregoing processes have been used in a variety of contexts to produce workpieces having suitable characteristics, there is a continual need in the industry to improve both the quality of the finished workpieces and the efficiency with which such workpieces are produced. The following disclosure describes systems and processes that meet these needs.

DETAILED DESCRIPTION

The following disclosure describes several embodiments of systems and methods for carrying out processes, including cleaning processes, on semiconductor wafers and other workpieces using a vapor. Specific details of several of the embodiments are described below in the context of removing contaminants from through-holes in semiconductor wafers. Several details describing structures or processes that are well-known and often associated with such systems and processes are not set forth in the following description for purposes of brevity. Moreover, although the following disclosure sets forth several representative embodiments, several other embodiments can have different configurations or different components that those described in this section. As such, other embodiments may have additional elements or may lack several of the elements described below with reference to FIGS. 2-5.

Figure 2:
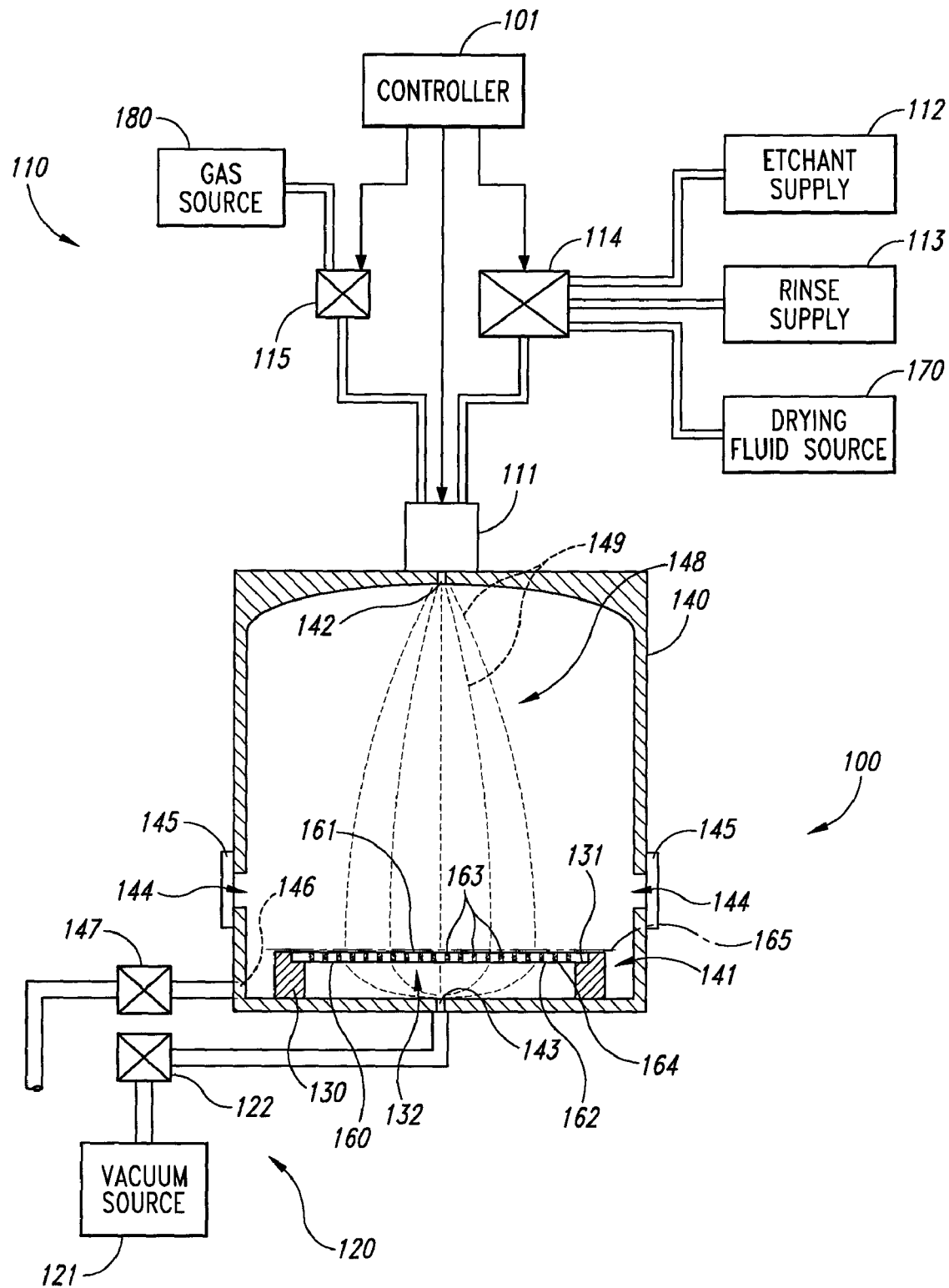
FIG. 2 is a partially schematic, side elevational illustration of a system configured in accordance with an embodiment of the invention for processing semiconductor workpieces having openings extending through the workpieces.

FIG. 2 is a schematic, side elevational illustration of a system 100 used to process a semiconductor workpiece 160 in accordance with several embodiments. The semiconductor workpiece 160 can include a semiconductor wafer, or another device having, or in the process of acquiring, semiconductor features. The system 100 can include a processing chamber 140 in which the semiconductor workpiece 160 is placed, a vapor supply 110 that provides a vapor 149 to the chamber 140, and a vapor sink 120 that removes the vapor 149 from the chamber 140 after the vapor 149 has interacted with the semiconductor workpiece 160. While the semiconductor workpiece 160 is in the chamber 140, it is carried by a workpiece support 130 at a process zone 141. In the process zone 141, openings 163 in the semiconductor workpiece 160 are exposed to the vapor 149 as the vapor 149 travels along a vapor flow path 148 between the vapor supply 110 and the vapor sink 120. A controller 101 can be operatively coupled to the foregoing components and other components of the system 100 to control several aspects of the operation of the system 100, as is described in further detail below.

The vapor supply 110 can include several elements or components that provide one or more vapors to the chamber 140 via a chamber inlet 142. In a particular embodiment, the vapor supply 110 includes a vaporizer 111 that is coupled to one or more liquid supplies so as to provide corresponding vapors to the chamber 140. For example, the vaporizer 111 can be coupled to an etchant supply 112, a rinse supply 113, and/or a drying fluid source 170. A multiport valve 114 is controlled (e.g., by the controller 101) to determine which of the liquids carried by the corresponding liquid supplies is provided to the vaporizer 111. In another embodiment, the multiport valve 114 can be replaced with a plurality of individual valves, and/or other regulator arrangements. The vaporizer 111 can include an ultrasound generator that produces a vapor via the introduction of ultrasonic energy to the liquid provided by the corresponding liquid supply. In other embodiments, the vaporizer 111 can have other arrangements. For example, the vaporizer 111 can include gas-fed injectors that vaporize the liquid via mixing with a gas stream. Accordingly, the vapor supply 110 can include a gas source 180 that provides a stream of gas (e.g., an inert gas, such as argon, nitrogen, or helium) to the vaporizer 111, which is controlled by a gas valve 115.

The vapor 149 provided by the vapor supply 110 is directed along the vapor flow path 148 as a result of a pressure difference between the vapor supply 110 and the vapor sink 120. Accordingly, the vapor sink 120 can include a vacuum source 121 that communicates with the chamber 140 via a vapor exit 143. A vacuum valve 122 under the control of the controller 101 can regulate the vacuum provided to the chamber 140. In other embodiments, the vapor sink 120 can include other devices configured to provide a pressure below the pressure at the vapor supply 110 and the interior of the chamber 140.

The semiconductor workpiece 160 can be positioned at the process zone 141 so that it is generally transverse to the vapor flow path 148 at a workpiece plane 165. Accordingly, the openings 163 in the semiconductor workpiece 160 can be readily exposed to the vapor 149. In a particular embodiment, the semiconductor workpiece 160 includes a generally circular semiconductor wafer having a first surface 161 facing generally toward the vapor inlet 142, and an oppositely facing second surface 162 facing generally toward the vapor exit 143. The openings 163 can extend through the semiconductor workpiece 160 from the first surface 161 to the second surface 162. For example, the openings 163 can include through-wafer vias or other through-holes suitable for forming conductive through-wafer interconnects.

In a particular arrangement, the semiconductor workpiece 160 is supported at its periphery by the workpiece support 130. Accordingly, the workpiece support 130 can include an annular contact surface 131 that contacts the outer periphery of the workpiece second surface 162. An aperture 132 positioned annularly inwardly from the contact surface 131 leaves the interior region of the second surface 162 exposed so that the vapor 148 can pass entirely through the workpiece openings 163 from the first surface 161 to the second surface 162. This particular arrangement is suitable for processes that are carried out when the pressure difference between the first surface 161 and the second surface 162 of the semiconductor workpiece 160 is relatively small. In cases where the pressure difference across the semiconductor workpiece 160 is higher, the workpiece support 130 can contact regions of the semiconductor workpiece 160 inside the outer periphery of the workpiece 160, as will be described in greater detail below with reference to FIGS. 4 and 5.

The openings 163 in the semiconductor workpiece 160 can include contaminants 164, for example, residual conductive or non-conductive particles that remain after the openings 163 are formed, and/or after conductive materials (e.g., barrier layers, conductive liners, and/or other materials) are disposed in the openings. During a cleaning process, the vapor 149 physically and/or chemically interacts with the contaminants 164 and, together with the contaminants 164, is drawn through and out of the openings 163 at the second surface 162, thereby removing the contaminants 164 from the semiconductor workpiece 160. In a particular embodiment, an etchant is used to clean the contaminants 164 from the openings 163 in the semiconductor workpiece 160. Representative etchants include TMAH, hydrogen peroxide, phosphoric acid, and/or other suitable compounds. The selection of the etchant can be dependent upon the characteristics of the semiconductor workpiece 160 and the expected contaminants 164 located in the openings 163. After the contaminants 164 have been removed from the semiconductor workpiece 160, the semiconductor workpiece 160 can be rinsed using a vapor having a different chemical composition. For example, the rinse supply 113 can include a supply of deionized water that, when vaporized and directed along the vapor flow path 148, rinses residual etchant from the semiconductor workpiece 160 after the contaminants 164 have been removed. A drying fluid (e.g., an inert gas) provided by the drying fluid source 170 can then be used to dry the semiconductor workpiece 160 prior to removing the semiconductor workpiece 160 from the chamber 140. Because the drying fluid is typically in the gas phase, it can bypass the vaporizer 111, or the vaporizer 111 can be inactive during the drying phase.

During the foregoing processes, some of the vapor 149 may condense within the chamber 140. This liquid can be removed from the chamber 140 via a liquid drain port 146. The flow of liquid from the liquid drain port 146 can be controlled by a drain valve 147.

After the foregoing processes are completed, the semiconductor workpiece 160 can be removed from the chamber 140 via one or more workpiece access ports 144 which are opened and closed with corresponding access doors 145. The next semiconductor workpiece 160 is then placed in the chamber 140 through the access port 144, the access doors 145 are closed, and the foregoing processes are repeated. After each semiconductor workpiece 160 has been cleaned, additional processes can be performed on the workpiece 160 outside the chamber 140. Such processes can include a conductive fill process that fills the cleaned openings 163 with a conductive material to provide a conductive, through-workpiece interconnect structure.

Figure 3:
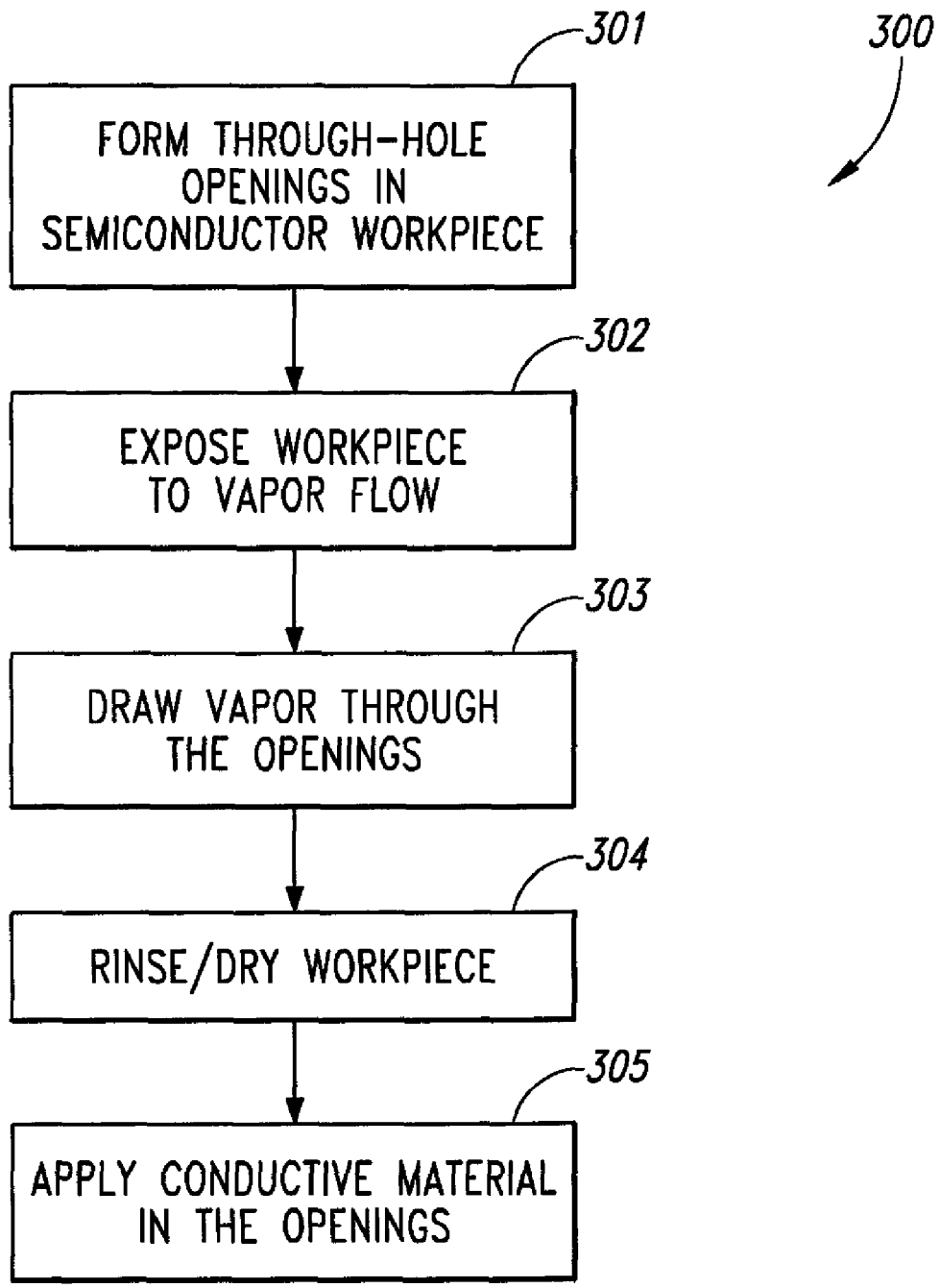
FIG. 3 is a block diagram illustrating a method for processing semiconductor workpieces in accordance with a particular embodiment.

FIG. 3 is a block diagram illustrating a process 300 for performing cleaning and/or other processes on a semiconductor workpiece, in accordance with particular embodiments. Process portion 301 includes forming through-holes in a semiconductor workpiece, e.g., openings that extend through the workpiece from one external surface to another, oppositely-facing surface. Process portion 302 includes exposing the semiconductor workpiece to a vapor flow. For example, the semiconductor workpiece can be placed in the chamber 140 described above with reference to FIG. 2, and exposed to a vapor flow that enters the chamber through the vapor inlet 142. In process portion 303, the vapor is drawn through the openings in the semiconductor workpiece. In a particular embodiment, the vapor entrains, mixes with, reacts with, and/or otherwise assists in removing contaminants from the openings as the vapor is drawn into, through and out of the openings. For example, in a particular embodiment, the contaminants can include metal particles having an oxide outer layer, and the vapor can include hydrogen peroxide or TMAH. The vapor can chemically react with the oxide layer and, as the vapor is drawn through the openings, can draw the contaminants along with it. Contaminants withdrawn from an opening in this manner pass through at least a portion of the opening, but may not pass through the entire opening. For example, contaminants located part-way along the axial length of the opening pass through only a portion of the opening before exiting.

The characteristics of the flow of the vapor through the openings can be controlled to enhance the cleaning effect and/or other effects produced by the vapor. For example, the size of the vapor droplets can be controlled to be smaller than the size of the openings through which the vapor is drawn. In a particular embodiment, the openings can range from about ten microns to about 100 microns in diameter, and in a further particular embodiment can be from about 40 to about 50 microns in diameter. The size of the corresponding vapor droplets drawn through the openings can range from about one micron to about five microns, with the size of the droplets selected to depend upon the size of the openings and/or the size of the contaminants that the vapor entrains and removes from the openings. In a further particular embodiment, the velocity of the vapor through the openings is controlled to produce near-turbulent flow, e.g., near a transition point between laminar flow and turbulent flow. It is expected that near-turbulent flow will increase the interaction between the vapor droplets and the contaminants in the opening. At the same time, it may be desirable not to have the flow become fully turbulent or highly turbulent, as such flow characteristics can reduce the level of control over the interaction process between the vapors and the contaminants. That said, in at least some other embodiments, laminar flow or fully turbulent flow may also be used, though the rate at which contaminants are removed from the workpiece with flows having such flow characteristics may not be as great as with near-turbulent flows.

In process portion 304, the semiconductor workpiece can be rinsed and/or dried prior to undergoing subsequent processing. In a particular arrangement, the rinsing and/or drying steps can be completed in the same chamber as is the cleaning step. In other arrangements, these steps can be performed in other chambers. In any of these arrangements, it is generally desirable to remove at least some and in many cases, all residual cleaning vapor from the semiconductor workpiece, e.g., by rinsing and/or drying. Accordingly, this process is unlike many existing vacuum-chamber deposition processes in which the primary purpose of the process is to permanently apply material to the workpiece. In process portion 305, conductive material is applied in the openings to form an interconnect structure. Further post-cleaning steps may also be performed to complete the formation of these structures.

One feature of several of the foregoing embodiments is that they include using a vapor to clean the openings (e.g., through-holes) of a semiconductor workpiece. It is expected that such an arrangement will require a lower volume of cleaning chemicals than conventional methods that require the workpiece to be dipped in a liquid bath. As a result, the costs for both acquiring and disposing of the cleaning chemicals can be reduced, thus reducing the cost of the overall manufacturing process. Furthermore, at least some of these embodiments can reduce the likelihood and/or severity of a liquid spill because the amount of liquid is reduced when compared to systems that include a liquid bath.

Figure 1A:
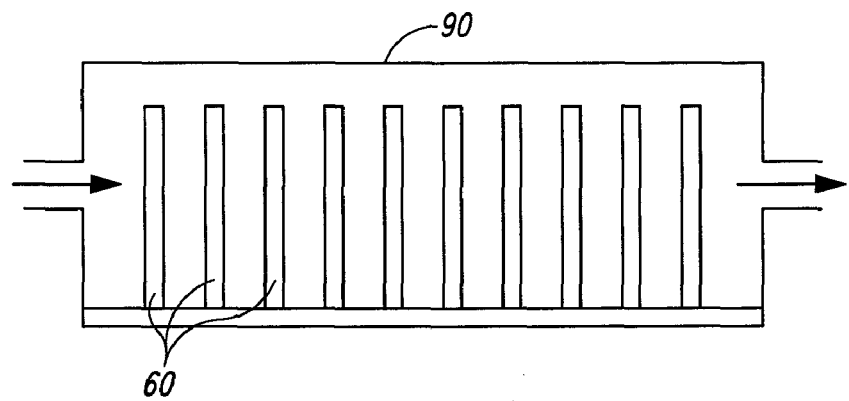
FIGS. 1A-1D are schematic illustrations of a process for forming and cleaning holes in semiconductor workpieces in accordance with the prior art.
Figure 1B:
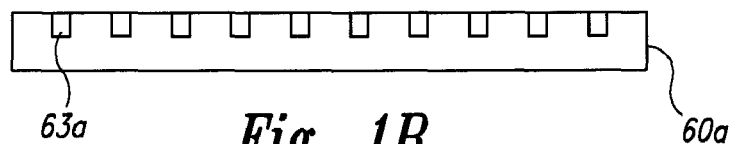
Figure 1C:
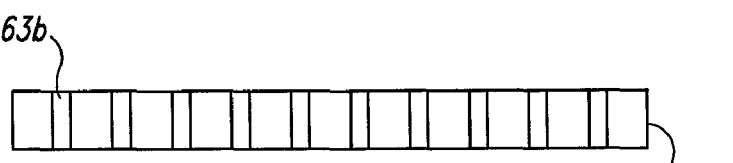
Figure 1D:
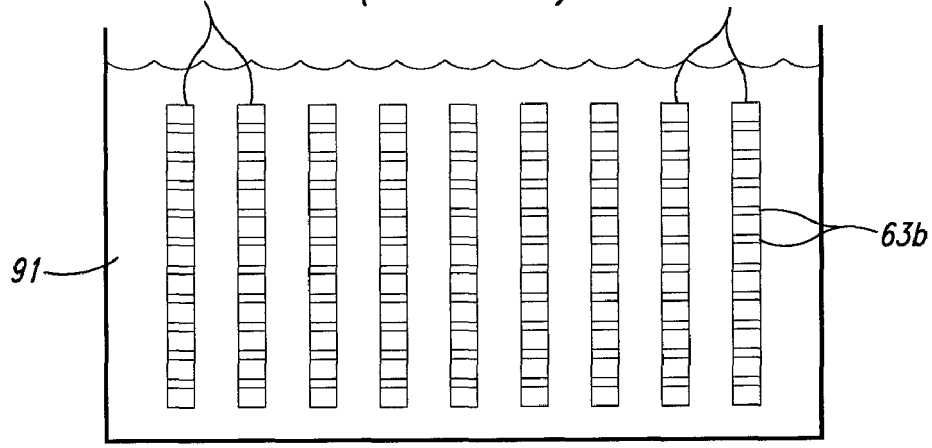

Another feature of at least several of the foregoing embodiments is that the vapor is accelerated through the openings in the workpiece, due to the pressure difference across the workpiece. It is expected that this feature can reduce the amount of time required to clean the workpieces. Still a further feature is that the contaminants within the openings of the workpiece are pulled away from the workpiece. Accordingly, the contaminants are less likely to re-attach to the workpiece than they would be in a bath. An additional feature of at least some embodiments is that the workpieces can be cleaned on an individual (e.g., workpiece-by-workpiece basis), with one workpiece in the chamber at a time. As a result, the contaminants removed from one workpiece are much less likely to be deposited on another workpiece, compared with the case when multiple workpieces are cleaned in a common bath, as is shown in FIG. 1D.

An additional drawback associated with at least some of the methods described above with reference to FIGS. 1A-1D is that the techniques used for cleaning blind holes may not be suitable for cleaning through-holes. For example, blind holes are typically cleaned in a high-temperature plasma etch process, during which the back side of the workpiece is cooled with helium or another gas to prevent the workpiece from overheating. However, when the holes extend completely through the workpiece, this back side cooling technique will typically not work because the cooling gas will leak or be sucked up through the holes in the workpiece. By contrast, the process described above with reference to FIGS. 2-3 does not require the workpiece to be exposed to a high-temperature plasma during cleaning, and accordingly does not require back side cooling via a special heat transfer gas. In fact, the vapor processes described above with reference to FIGS. 2-3 can be conducted at temperatures of about 80° C., and both the workpiece and the workpiece support can be kept at temperatures of about this value. This is unlike typical plasma processes, during which the workpiece can reach temperatures of up to and above 160° C. Accordingly, it is expected that embodiments of the vapor cleaning process will use up less of the "thermal budget" allocated to the workpiece. This in turn can improve the reliability of the workpiece and/or allow other, perhaps more critical, functions to be performed at elevated temperatures.

Figure 4:
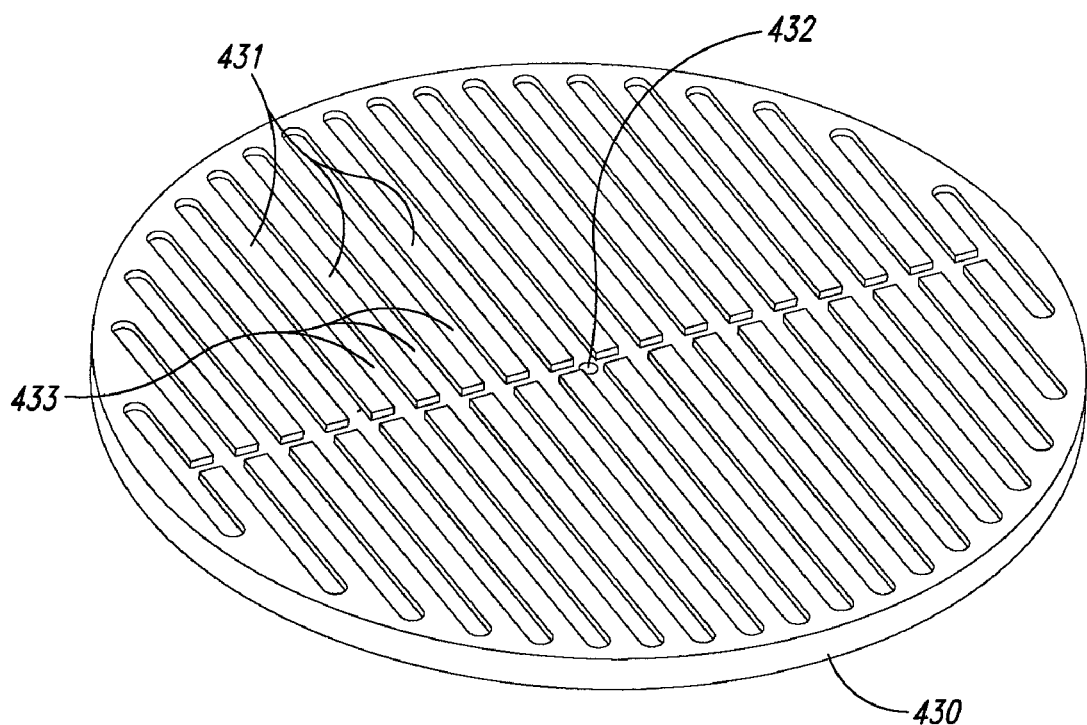
FIG. 4 is a top isometric illustration of a workpiece support configured to carry semiconductor workpieces in accordance with a particular embodiment.

The workpiece support 130 described above with reference to FIG. 2 carries the corresponding semiconductor workpiece 160 at its periphery. This arrangement is suitable for exposing both ends of the openings through the semiconductor workpiece to the vapor at relatively low pressure differential values. In some cases, the pressure differential across the workpiece required to create the near-turbulent flow described above may be so large as to crack or bow a workpiece that is carried only at its periphery. Accordingly, in at least some cases, the workpiece can be further supported when it is exposed to the vapor. For example, FIG. 4 illustrates a workpiece support 430 having a central aperture 432 that extends entirely through the workpiece support 430, and a series of channels 433 that are in fluid communication with the central aperture 432. Accordingly, the effect of a vacuum at the central aperture 432 can be distributed over most or all of the semiconductor workpiece surface (not shown in FIG. 4). Contact surfaces 431 are positioned between the channels 433 to provide contact support with the semiconductor workpiece carried by the workpiece support 430. In the particular arrangement shown in FIG. 4, the contact surfaces 431 and the channels 433 are arranged in a series of parallel rows. In other embodiments, the contact surfaces 431 and the channels 433 can be arranged in other manners, for example, in a radial and/or circumferential manner. In still further embodiments, the central aperture 432 can be supplemented with or supplemented by other apertures, and in a particular embodiment, the channels 433 or portions of the channels 433 can extend entirely through the workpiece support 430.

Figure 5:
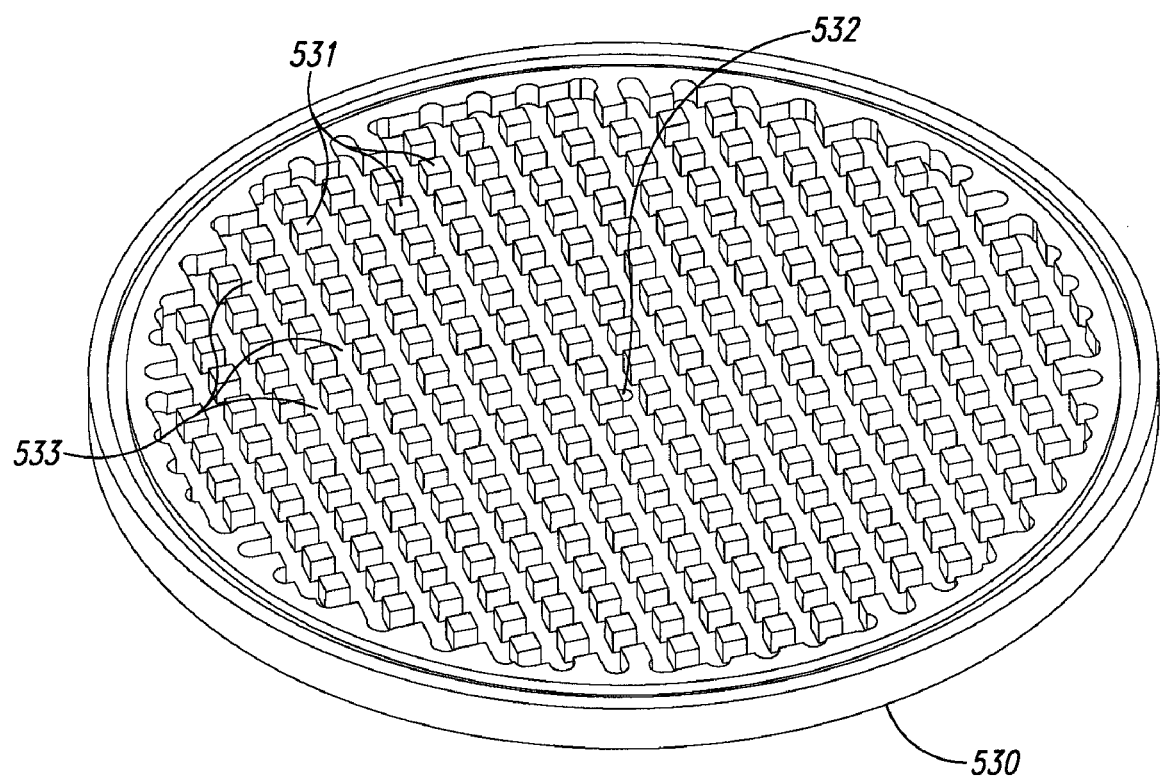
FIG. 5 is a top isometric illustration of a workpiece support configured to carry semiconductor workpieces in accordance with a particular embodiment.

FIG. 5 illustrates a workpiece support 530 configured in accordance with another embodiment. In this particular embodiment, the workpiece support 530 includes a central aperture 532 in fluid communication with a grid of channels 533 to distribute the vacuum effect over the downwardly facing surface of the semiconductor workpiece. Interlineated contact surfaces 531 support the overlying semiconductor workpiece (not shown in FIG. 5). In a manner generally similar to that discussed above with reference to FIG. 4, the central aperture 532 can be supplemented by or replaced with other apertures, including an arrangement in which the channels 533 or portions of the channels 533 extend entirely through the workpiece support 530. In particular aspects of any of the embodiments described above with reference to FIGS. 4 and 5, the workpiece supports can contact between 30% and 50% of the surface area of the semiconductor workpiece. In further embodiments, this value can be increased, e.g., for very high differential pressures across the workpiece, or decreased, e.g., for lower pressure differentials.

From the foregoing, it will be appreciated that specific embodiments have been described herein for purposes of illustration, but that other embodiments may include various modifications. For example, vapor chambers in accordance with other embodiments may have arrangements other than those shown and described above. The openings in the semiconductor workpieces can be generally aligned with the vapor flow path as shown in FIG. 2, or the openings can have other orientations in other embodiments. The semiconductor workpieces can include generally circular semiconductor wafers, or other devices (e.g., dies or portions of semiconductor wafers) having semiconductor features. The workpiece supports can have arrangements other than those specifically discussed above (e.g., the support surfaces can be pointed in a "bed of nails" arrangement). Certain aspects described in the context of particular embodiments may be combined or eliminated in other embodiments. For example, workpiece supports in particular embodiments can include combinations of characteristics of any of the workpiece supports described above. Further, while advantages associated with certain embodiments have been described in the context of those embodiments, other embodiments may also exhibit such advantages, and not all embodiments need necessarily exhibit such advantages to fall within the scope of the invention. Accordingly, embodiments of the disclosure are not limited except as by the appended claims.

I claim:

1. An apparatus for processing semiconductor workpieces, comprising:
   a workpiece chamber having an inlet, an outlet, and a processing zone between the inlet and the outlet;
   a vapor supply in fluid communication with the processing zone via the inlet, the vapor supply being configured to supply a plurality of vapor droplets to the processing zone, the vapor supply including a plurality of liquid supplies coupled to a vaporizer, wherein none of the liquid supplies contain a material that is permanently applied to a semiconductor workpiece via the vapor supply;
   a vapor sink in fluid communication with the processing zone via the outlet, the vapor sink being configured to remove the vapor from the processing zone;
   a workpiece support positioned to carry the semiconductor workpiece at the processing zone and in a vapor flow path between the vapor supply, the inlet of the workpiece chamber, the processing zone, the outlet of the workpiece chamber, and the vapor sink; and
   a controller operatively coupled to the vapor supply, the controller being configured to control a size of vapor droplets from the vapor supply based on a size of openings in the semiconductor workpiece carried by the workpiece support.

2. The apparatus of claim 1 wherein the workpiece support includes an aperture through which the vapor flow path passes.

3. The apparatus of claim 2 wherein the workpiece support includes multiple contact surfaces positioned to contact a semiconductor workpiece, and wherein neighboring contact surfaces are separated by a flow channel that is in fluid communication with the aperture through the workpiece support.

4. The apparatus of claim 1 wherein the workpiece support is positioned to carry a semiconductor workpiece at a workpiece plane that is transverse to the vapor flow path.

5. The apparatus of claim 1 wherein the workpiece support is the only workpiece support in the processing zone, and wherein the workpiece support is configured to carry at most one semiconductor workpiece.

6. The apparatus of claim 1 wherein the workpiece support includes a contact surface positioned to contact a peripheral region of the semiconductor workpiece.

7. The apparatus of claim 1 wherein the vapor sink has a lower pressure than the vapor source.

8. The apparatus of claim 1 wherein the vapor sink includes a vacuum device.

9. The apparatus of claim 1 wherein the vapor supply produces a supply of vapor droplets suspended in a gas.

10. The apparatus of claim 1 wherein the vapor supply includes a liquid source coupled in fluid communication with a vaporizer.

11. The apparatus of claim 10 wherein the liquid source and the vaporizer are positioned external to the workpiece chamber.

12. The apparatus of claim 10 wherein the liquid source includes an etchant.

13. The apparatus of claim 10 wherein the liquid source includes a rinse liquid.

14. The apparatus of claim 1, further comprising a source of drying fluid coupled to the processing zone.

15. An apparatus for processing semiconductor workpieces, comprising:
   a workpiece chamber having an inlet, an outlet, and a processing zone between the inlet and the outlet;
   a vapor supply in fluid communication with the processing zone via the inlet, the vapor supply being configured to supply a plurality of vapor droplets to the processing zone, the vapor supply including a plurality of liquid supplies coupled to a vaporizer, wherein none of the liquid supplies contain a material that is permanently applied to a semiconductor workpiece via the vapor supply;
   a vapor sink in fluid communication with the processing zone via the outlet, the vapor sink being configured to remove the vapor from the processing zone;
   a workpiece support positioned to carry the semiconductor workpiece at the processing zone and in a vapor flow path between the vapor supply, the inlet of the workpiece chamber, the processing zone, the outlet of the workpiece chamber, and the vapor sink, wherein the semiconductor workpiece includes a plurality of through vias in a central region inward from a peripheral region, and wherein the workpiece support includes a generally annular surface configured to support the peripheral region of the semiconductor workpiece without blocking the through vias in a central region of the semiconductor workpiece; and
   a controller operatively coupled to the vapor supply, the controller being configured to control a size of vapor droplets from the vapor supply based on a size of through vias in the semiconductor workpiece carried by the workpiece support.

16. The apparatus of claim 15 wherein the workpiece support includes an aperture defined by the generally annular surface, and wherein the vapor flow path passes through the aperture of the workpiece support.

17. The apparatus of claim 15 wherein:
   the workpiece support includes an aperture defined by the generally annular surface;
   the aperture generally corresponds to the plurality of through vias in the semiconductor workpiece; and the vapor flow path passes through the aperture of the workpiece support.

18. The apparatus of claim 15 wherein the workpiece support is positioned to carry a semiconductor workpiece at a workpiece plane that is transverse to the vapor flow path.

19. The apparatus of claim 15 wherein the liquid supplies individually include at least one of an etchant, a rinse liquid, and a drying fluid.

20. The apparatus of claim 1 wherein the vapor sink is configured to completely remove the vapor from the processing zone.

21. The apparatus of claim 15 wherein the vapor sink is configured to completely remove the vapor from the processing zone.

* * * * *